(12) United States Patent
Shirai

(10) Patent No.: US 7,500,212 B2
(45) Date of Patent: Mar. 3, 2009

(54) METHOD, APPARATUS AND PROGRAM FOR AUTOMATICALLY ROUTING SEMICONDUCTOR INTEGRATED CIRCUIT

(75) Inventor: Katsunori Shirai, Kanagawa (JP)

(73) Assignee: NEC Electronics Corporation, Kanagawa (JP)

( * ) Notice: Subject to any disclaimer, the term of this patent is extended or adjusted under 35 U.S.C. 154(b) by 437 days.

(21) Appl. No.: 11/348,340

(22) Filed: Feb. 7, 2006

(65) Prior Publication Data

US 2006/0190902 A1 Aug. 24, 2006

(30) Foreign Application Priority Data

Feb. 22, 2005 (JP) ............................ 2005-045483

(51) Int. Cl.
*G06F 17/50* (2006.01)
(52) U.S. Cl. .............................. 716/12; 716/10; 716/13; 716/14
(58) Field of Classification Search ..................... 716/1, 716/9–14, 5
See application file for complete search history.

(56) References Cited

U.S. PATENT DOCUMENTS 7,215,196 B2 * 5/2007 Banba et al. ................. 330/254
2003/0001666 A1 * 1/2003 Watanabe et al. ............ 327/563
2004/0025132 A1 * 2/2004 Valine .......................... 716/11
2004/0068709 A1 * 4/2004 Hojat et al. ................... 716/10
2004/0160242 A1 * 8/2004 Rahman ....................... 326/83
2005/0207280 A1 * 9/2005 Fowler et al. ................. 368/10
2006/0095872 A1 * 5/2006 McElvain et al. .............. 716/1

FOREIGN PATENT DOCUMENTS

JP 9-044539 2/1997

* cited by examiner

*Primary Examiner*—Paul Dinh
(74) *Attorney, Agent, or Firm*—Foley & Lardner LLP

(57) ABSTRACT

Disclosed is an apparatus for performing automatic routing of a semiconductor integrated circuit, including an automatic routing and search processing unit for outputting post-routing layout data upon receiving inputs of post-routing layout data, circuit data and differential-signal information. The automatic routing and search processing unit includes: a differential-signal routing setting unit for designating a signal specified by the differential-signal information from the circuit data, generating dummy terminals, searching for a guide wiring of large line width and performing layout; a wiring path search unit for performing all signal routing inclusive of normal routing while avoiding a power supply wiring and a wiring-inhibited area; a large-to-small line width converter for reducing the line width only of enlarged line width guide wirings specified by differential signals; a differential-signal routing unit for routing differential signals in parallel along locations where the line width of the guide wiring of enlarged line width has been reduced; and a shield routing unit for performing shield routing.

20 Claims, 15 Drawing Sheets

METHOD, APPARATUS AND PROGRAM FOR AUTOMATICALLY ROUTING SEMICONDUCTOR INTEGRATED CIRCUIT

FIELD OF THE INVENTION

This invention relates to automatic routing in the design of a semiconductor integrated circuit. More particularly, the invention relates to a method, an apparatus and a computer program ideal for application to an automatic router for high-speed signals and clock employing CAD (Computer Aided Design).

BACKGROUND OF THE INVENTION

With the advance in the miniaturization process of semiconductor devices, problems relating to IR-DROP (a drop in voltage) in power supply wiring or the like and SI (Signal Integrity) such as crosstalk have become more significant.

Furthermore, as signal and clock speeds have been elevated, the degree of single-phase signal degradation has become more extreme. For this reason, wide spread use is made of circuits that adopt differential or multiphase arrangements in order to avoid the problems mentioned above. In this case, however, manual routing of wiring is used primarily as the routing method.

FIG. 14 is a diagram illustrating a method of automatically routing differential signals as described in the specification of Japanese Patent Kokai Publication No. JP-A-09-044539 (Patent Document 1). As shown in FIG. 14, a positive-phase output 401a and a negative-phase output 401b of a cell 401 are connected to a positive-phase output 402a and a negative-phase output 402b, respectively, of a cell 402 by wirings 409a and 409b, respectively. After one signal (referred to as "signal A") of differential wiring has been routed while avoiding a wiring-inhibited area A, a path of the other signal (referred to as "signal B") is searched for so as to connect the wiring for this signal.

It is assumed in FIG. 14 that the signal A is at 409a and that signal B is at 409b. If, when the search for signal A (409a) is conducted, signal B (409b) engages a wiring-inhibited area B, as shown in FIG. 15, then the signal routing of signal A (409a) is redone during the search for the path of signal B. If routing can be performed with neither signal A nor signal B engaging a wiring-inhibited area, then routing is completed.

[Patent Document 1]

Japanese Patent Kokai Publication No. JP-A-09-044539

Thus, if a routing failure occurs owing to a wiring-inhibited area when signal B is routed after signal A, the signal A must be re-routed. This lengthens the time required for routing.

Further, if differential wiring is used mainly by a high-speed signal and the routing of signal B is performed in a grid adjacent to the wiring of signal A, the capacitance between the two wirings doubles owing to the differential signals and it is very likely that signal degradation will increase.

SUMMARY OF THE DISCLOSURE

The present invention has been devised as a result of exhaustive research in order to solve the aforementioned problems and is so adapted that a search of path is performed a single time and the spacing between differential signals is enlarged to enable a reduction in parasitic capacitance.

More specifically, the present invention provides a method of performing automatic routing of a semiconductor integrated circuit in which a differential-signal wiring pair connecting a first differential terminal pair and a second differential terminal pair spaced away from the first differential terminal pair is routed based upon layout information and circuit information that has been read out of storage means, the method comprising the steps of reserving a path in an area between the first and second differential terminal pairs by searching for a path of a guide wiring of a predetermined line width in the area, and routing the differential-signal wiring pair along the path reserved.

Preferably, in the method according to the present invention, said guide wiring has a line width large enough to encompass the differential signal wiring pair.

Further, the present invention provides an apparatus for performing automatic routing of a semiconductor integrated circuit, comprising: a storage unit for storing pre-routing layout information and circuit information prevailing after cell placement; and a routing unit for receiving the layout information and circuit information from said storage unit, said routing unit routing a differential-signal wiring pair connecting a first differential terminal pair and a second differential terminal pair spaced away from the first differential terminal pair, said routing unit reserving a path in an area between the first and second differential terminal pairs by searching for a path of a guide wiring of a predetermined line width in said area, and routing the differential-signal wiring pair along the path reserved.

Further, the present invention provides a computer program for causing a computer, which implements an apparatus for performing automatic routing of a semiconductor integrated circuit, to execute the following processing: processing for inputting pre-routing layout information and circuit information, which prevails after cell placement, from storage means in which this layout information and circuit information has been stored; and routing processing for routing a differential-signal wiring pair connecting a first differential terminal pair and a second differential terminal pair spaced away from the first differential terminal pair, the routing processing reserving a path in an area between the first and second differential terminal pair by searching for a path of a guide wiring of a predetermined prescribed line width in the area, and routing the differential-signal wiring pair along the path reserved.

In the computer program according to the present invention, the guide wiring preferably has a line width large enough to encompass the differential signal wiring pair.

According to another aspect of the present invention, there is provided a method of automatically routing a semiconductor integrated circuit by computer including a step of deciding a path of a first wiring connecting a first output terminal of a first circuit having first and second output terminals and a first input terminal of a second circuit having first and second input terminals, and a path of a second wiring connecting the second output terminal and the second input terminal, based upon layout information and circuit information that has been read out of storage means, the method comprising: a first step of generating a dummy output terminal between the first and second output terminals and a dummy input terminal between the first and second input terminals; a second step of searching for a path of a wiring of enlarged line width connecting the dummy output terminal and the dummy input terminal, and performing routing of the wiring of enlarged line width along the path; and a third step of reducing the line width of the wiring of enlarged line width and passing the first and second wirings along respective ones of both sides of the wiring of reduced line width.

According to a further aspect of the present invention, there is provided an apparatus for performing automatic routing of a semiconductor integrated circuit, the apparatus deciding a path of a first wiring connecting a first output terminal of a first circuit having first and second output terminals and a first input terminal of a second circuit having first and second input terminals, and a path of a second wiring connecting the second output terminal and the second input terminal, based upon layout information and circuit information that has been read out of storage means, the apparatus comprising: a routing setting unit for generating a dummy output terminal between the first and second output terminals and a dummy input terminal between the first and second input terminals; a wiring path search unit for searching for a path of a wiring of enlarged line width connecting the dummy output terminal and the dummy input terminal, and performing routing of the wiring of enlarged line width along the path; a line width converter for reducing the line width of the wiring of enlarged line width; and a routing unit for passing the first and second wirings along respective ones of both sides of the wiring of reduced line width.

In the present invention, it may be so arranged that the line width of the wiring of enlarged line width is reduced, the area that was occupied by the wiring of reduced line width is adopted as a wiring-inhibited area, and the first and second wirings are passed along respective ones of both sides of the wiring-inhibited area.

In the present invention, the first and second output terminals form differential output terminals and the first and second input terminals form differential input terminals.

In the present invention, the wiring of enlarged line width is provided with a line width that corresponds to the sum of a wiring space between the first and second wirings and line widths of the first and second wirings.

In the present invention, it may be so arranged that first and second shield wirings are provided so as to embrace the first wiring and the second wiring. The wiring of large line width preferably is provided with a line width that corresponds to a wiring space of the first and second shield wirings and line widths of the first and second shield wirings.

In a semiconductor integrated circuit according to a further aspect of the present invention, a path for a guide wiring of prescribed line width is searched for in an area between first and second differential terminal pairs, width of the guide wiring is reduced, and differential-signal wirings connecting said first and second differential terminal pairs are routed along respective ones of both sides of said reduced line width wiring guide. In the semiconductor integrated circuit according to the present invention, the guide wiring of reduced line width is adopted as a shielding wiring. In the semiconductor integrated circuit according to the present invention, the guide wiring of reduced line width is deleted and the area that was occupied by the guide wiring of reduced line width is adopted as a wiring-inhibited area.

The meritorious effects of the present invention are summarized as follows.

In accordance with the present invention, routing having a line width large enough to encompass differential-signal wirings is performed. As a result, a path can be searched for while reserving an area equivalent to the differential-signal wirings, and it is possible to suppress an increase in length of wiring time.

Further, in accordance with the present invention, after wiring of large line width is performed, the width thereof is reduced, shield wiring or a vacant area is left between the wirings of the differential signals and therefore capacitance between the wirings can be reduced. Signal degradation is diminished as a result.

Other features and advantages of the present invention will be apparent from the following description taken in conjunction with the accompanying drawings, in which like reference characters designate the same or similar parts throughout the figures thereof.

PREFERRED EMBODIMENTS OF THE INVENTION

Preferred embodiments of the present invention will now be described in detail with reference to the accompanying drawings.

The present invention provides a routing method performed by an auto router, which includes a step of deciding a path of a first wiring connecting a first output terminal of a first circuit having first and second output terminals and a first input terminal of a second circuit having first and second input terminals, and a path of a second wiring connecting the second output terminal and the second input terminal, based upon layout information and circuit information that has been read out of storage means. The method according to the present invention comprises the steps of generating a dummy output terminal between the first and second output terminals; generating a dummy input terminal between the first and second input terminals; reserving a path upon searching for a path of a wiring of large line width connecting the dummy output terminal and dummy input terminal that have been generated; and subsequently reducing the line width of the wiring of large line width and passing the first and second wirings along respective ones of both sides of the wiring of reduced line width. The configuration of a system according to an embodiment of the present invention will now be described.

Figure 1:
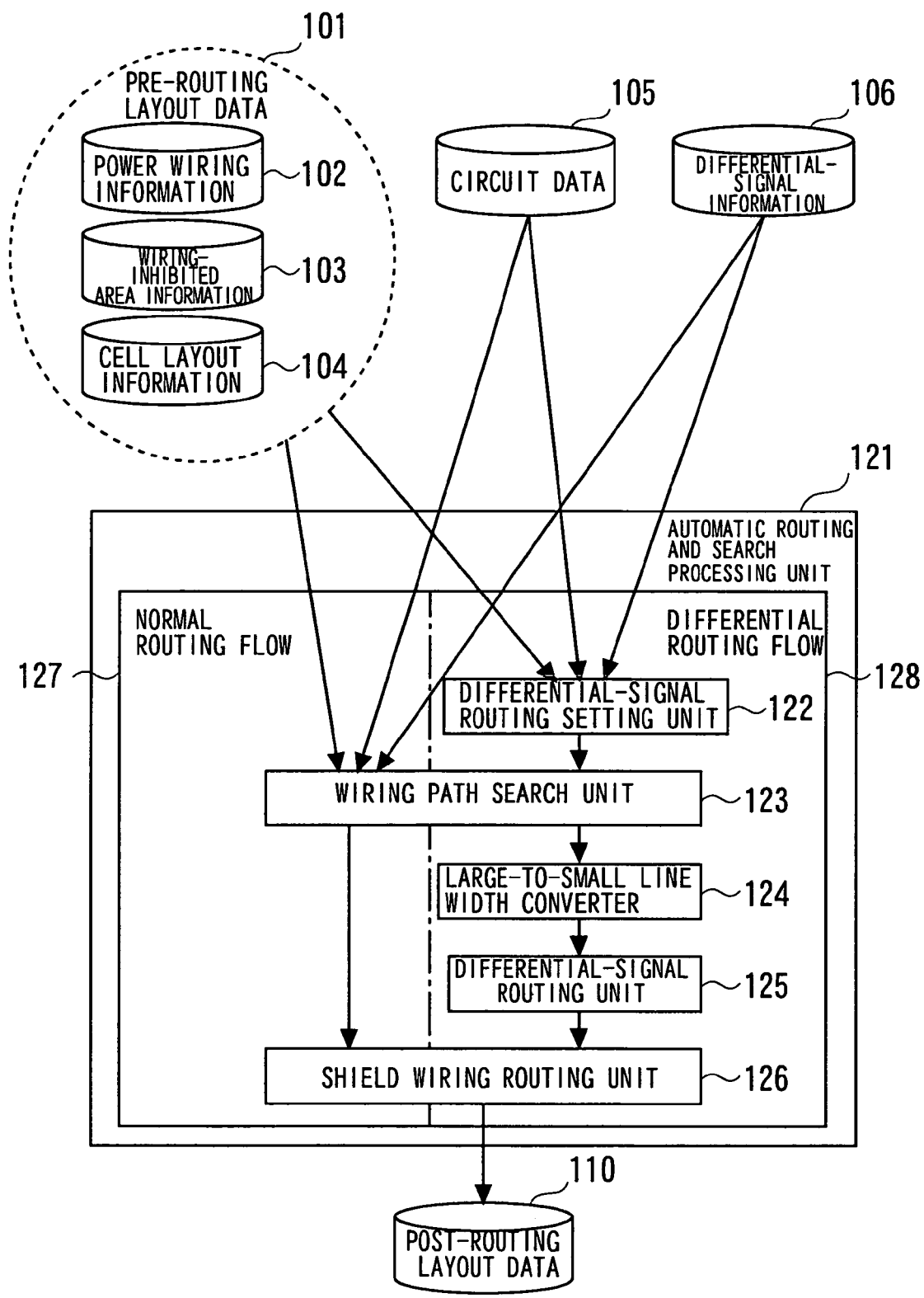
FIG. 1 is a diagram illustrating the structure of an embodiment of the present invention.

FIG. 1 is a block diagram illustrating the structure of the present embodiment of the invention. The system includes layout data 101 in which cell placement has already been completed but routing has not yet been performed (this data shall be referred to as "pre-routing layout data 101"); circuit data 105 which contains circuit element information and a net list thereof; differential-signal information 106 comprising information on signals to be routed differentially; and an automatic routing and search processing unit 121.

The pre-routing layout data 101, circuit data 105 and differential-signal information 106 are stored in a storage unit. The pre-routing layout data 101 has at least power wiring information 102, wiring-inhibited area information 103 and cell layout information 104.

The automatic routing and search processing unit 121 preferably is implemented by a data processing unit controlled based upon software (a computer program). The data processing unit includes a CPU (not shown) that accesses the storage unit, reads out data and processes the data. The automatic routing and search unit 121 preferably has an output unit (not shown) for outputting the results of routing processing, etc.

As shown in FIG. 1, the automatic routing and search processing unit 121 includes a differential-signal routing setting unit 122, a wiring path search unit 123, a large-to-small line width converter 124, a differential-signal routing unit 125 and a shield wiring routing unit 126. Differential routing comprises a processing flow in a portion of the unit 121 that is enclosed by a differential routing flow 128. Normal routing is performed by the wiring path search unit 123 and shield wiring routing unit 126 in a portion of the unit 121 that is enclosed by a normal routing flow 127.

The pre-routing layout data 101 in which cell placement has already been completed, the circuit data (circuit information) 105 and the differential-signal information 106 are supplied to the automatic routing and search processing unit 121, which proceeds to process this data and information and to output post-routing layout data 110.

The differential-signal routing setting unit 122 is set so as to designate a signal specified by the differential-signal information 106 from the circuit data 105, generate preliminary dummy terminals, search for a guide wiring of large line width and perform layout.

The pre-routing layout data 101 in which cell layout has already been completed, the circuit data 105 and the differential-signal information 106 are input to the wiring path search unit 123, which proceeds to perform all signal routing inclusive of normal routing while avoiding a power wiring and a wiring-inhibited area.

The large-to-small line width converter 124 reduces the width only of guide wirings of large line width which are specified as differential signals.

The differential-signal routing unit 125 routes a differential signal pair in parallel along locations where guide wirings of large line width have been narrowed.

The shield wiring routing unit 126 performs of routing of a shield wiring, while avoiding a power supply wiring and a wiring-inhibited area, in order to reduce crosstalk in relation to all signal wiring.

It may be so arranged that the components constructing the automatic routing and search processing unit 121 implement the processing and functions of the unit by a program executed by a data processing unit (computer). The processing by the automatic routing and search processing unit 121 shown in FIG. 1 will be described below in accordance with an embodiment applied to specific circuitry.

Figure 2:
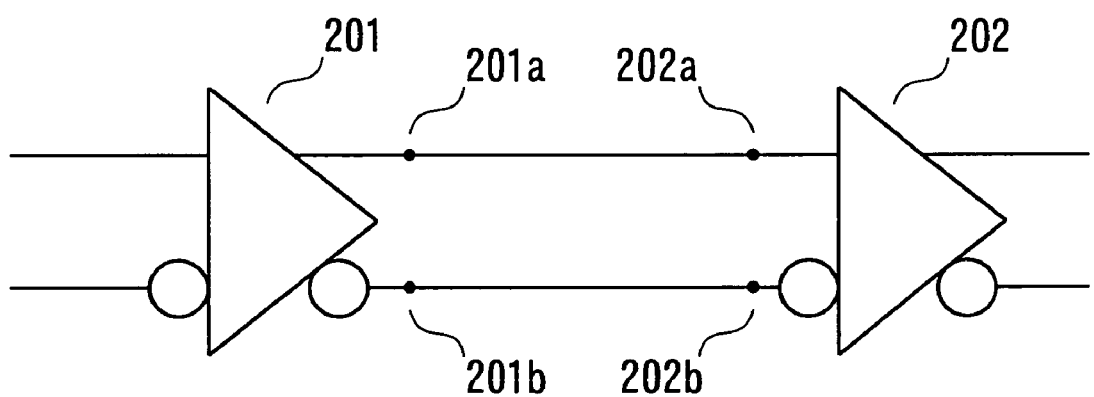
FIG. 2 is a diagram illustrating a circuit to which routing according to the present embodiment of the invention is applied.

FIG. 2 is a diagram illustrating a circuit for describing routing according to the present embodiment of the present invention. A positive-phase output 201a and a negative-phase output 201b of a differential-type inverter 201 are connected to a positive-phase input 202a and a negative-phase input 202b, respectively, of a differential-type inverter 202. Outputs 201a and 201b constitute a differential output pair and inputs 202a and 202b constitute a differential input pair.

Figure 3:
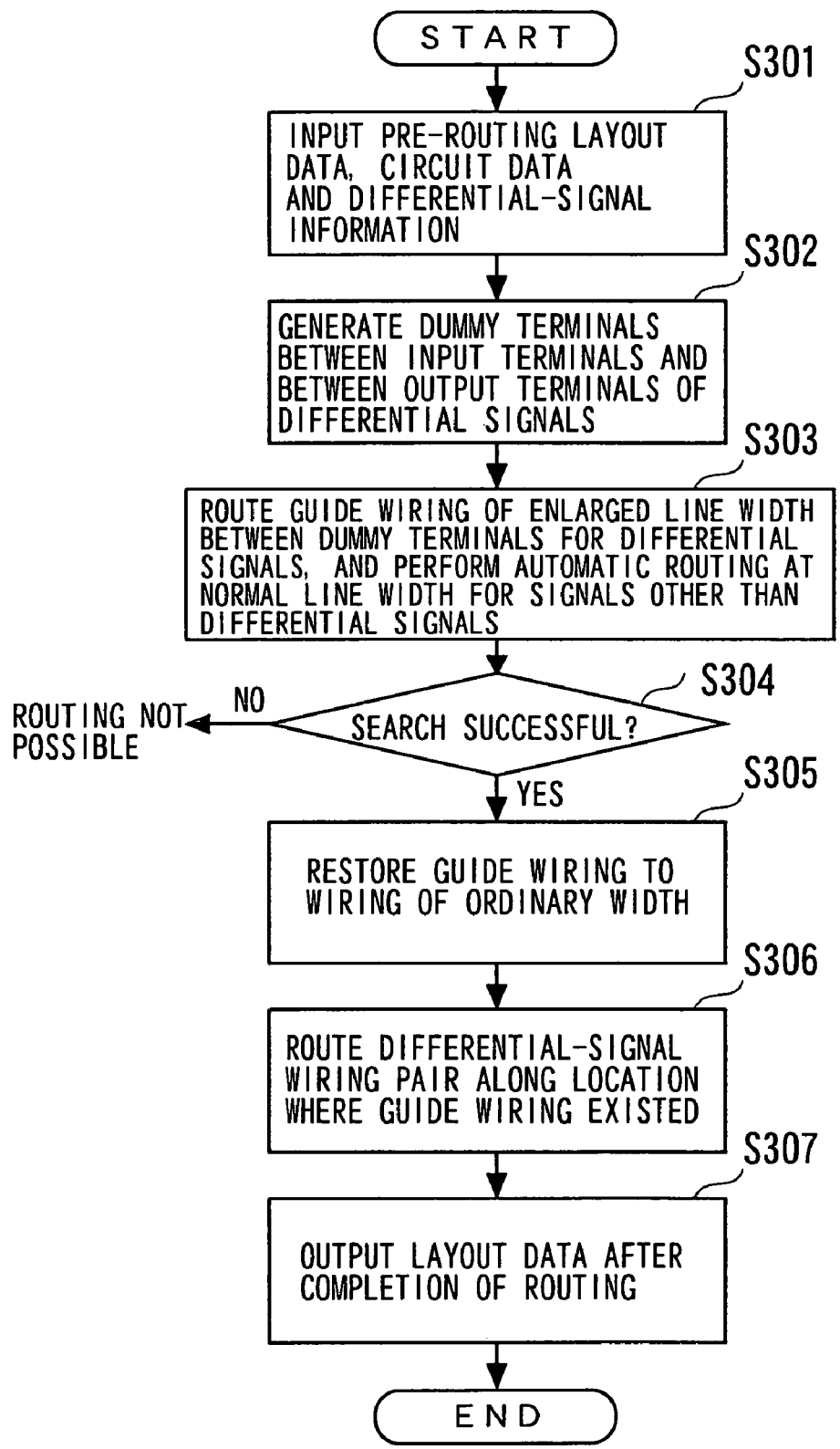
FIG. 3 is a flowchart illustrating processing according to an embodiment of the present invention.

FIG. 3 is a flowchart illustrating processing for differential-signal routing in the present embodiment of the invention. An example in which automatic layout of differential-signal wiring for the circuit of FIG. 2 is implemented will be described in accordance with the flowchart of FIG. 3.

First, the differential-signal routing setting unit 122 receives the pre-routing layout data 101, circuit data 105 and differential-signal information 106 as inputs thereto (step S301).

Figure 4:
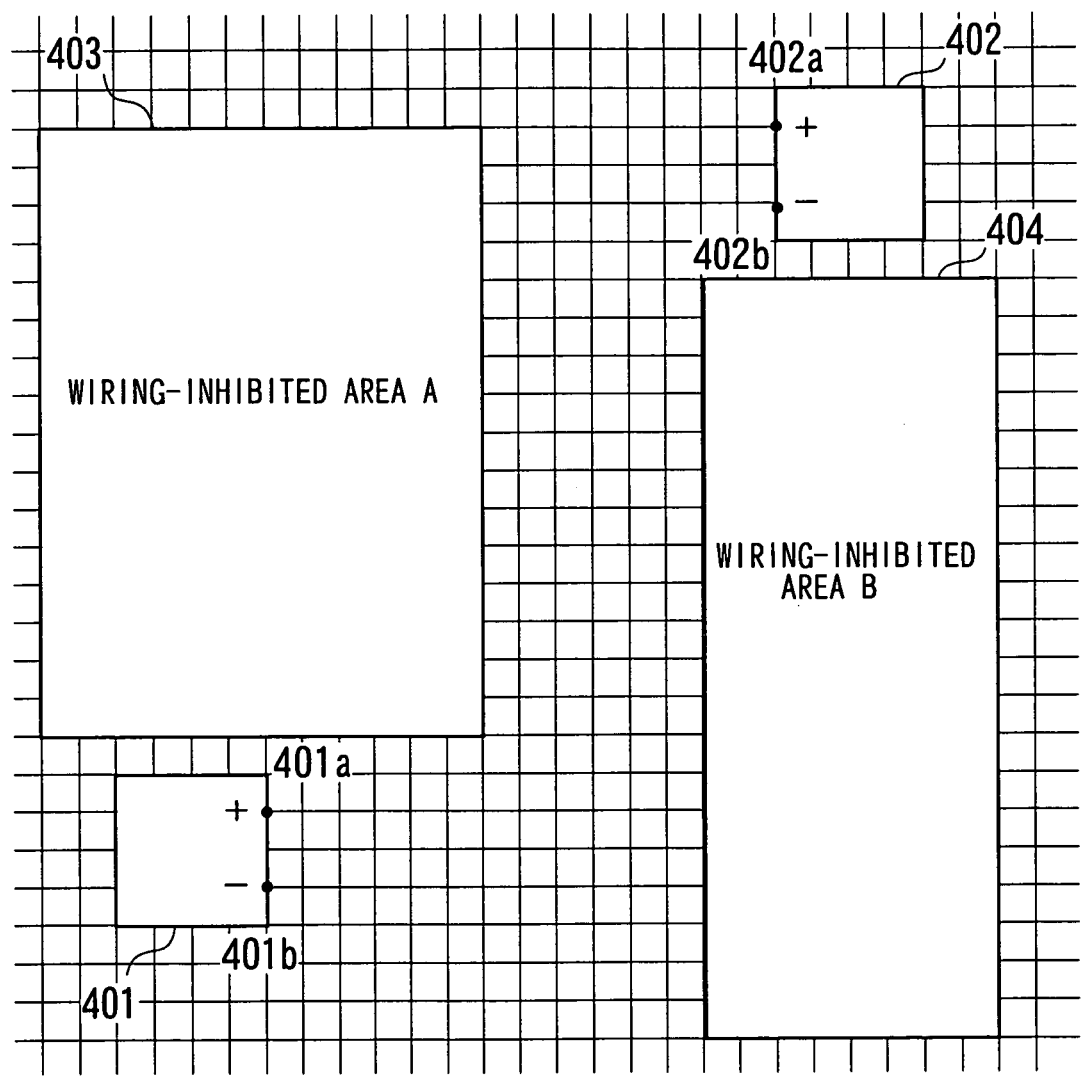
FIGS. 4 to 9 are diagrams useful in describing a routing process according to an embodiment of the present invention.

FIG. 4 illustrates an example of the pre-routing layout data 101 in which the placement of cells in the circuit diagram of FIG. 2 has been completed. The differential inverter 201 of FIG. 2 is a cell 401, and the positive-phase output 201a and negative-phase output 201b correspond to 401a and 401b, respectively. It is assumed that a wiring-inhibited area (A) 403 and a wiring-inhibited area (B) 404 are present at the locations shown in FIG. 4.

Figure 5:
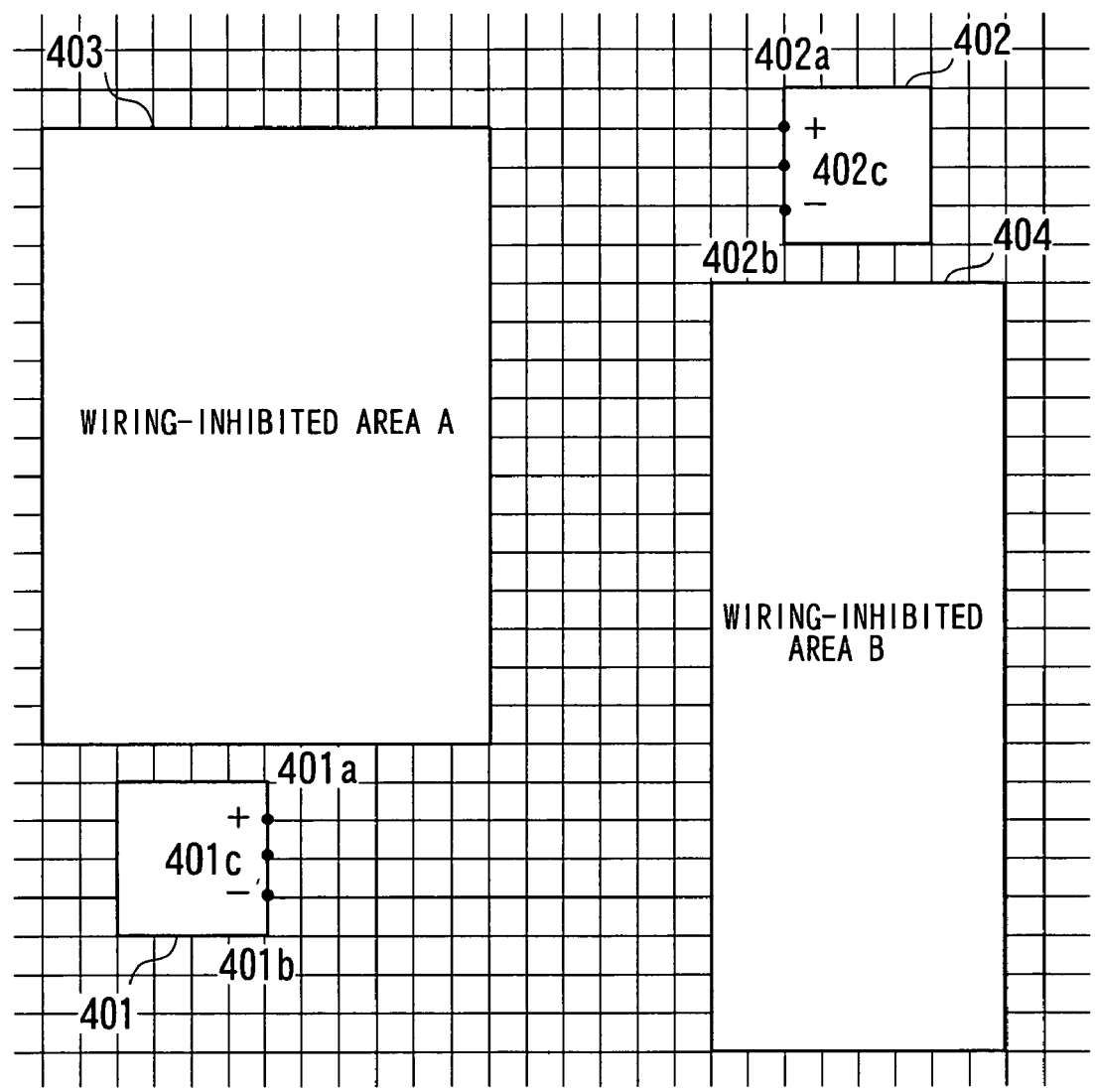

From the conditions shown in FIG. 4, the differential-signal routing setting unit 122 generates a dummy output terminal 401c between the positive-phase output terminal 401a and negative-phase output terminal 401b of cell 401 (step S302). Similarly, the differential-signal routing setting unit 122 generates a dummy output terminal 402c between the positive-phase output terminal 402a and negative-phase output terminal 402b of cell 402 (see FIG. 5).

Information connecting the positive-phase output 401a with the positive-phase output 402a and the negative-phase output 401b with the negative-phase output 402b is defined in the circuit data 105. However, this is changed to wiring connecting the dummy output terminal 401c and the dummy output terminal 402c, and the line width of this wiring is changed so as to be the sum of two signal wiring line widths and a wiring space reserved between these wirings. The line width of a wiring connecting the dummy output terminal 401c and the dummy output terminal 402c (this wiring shall be referred to as a "guide wiring") is required to be at least three times the minimum wiring grid. In the present embodiment, the guide wiring has a line width that is three times the minimum wiring grid.

The wiring path search unit 123 routes the guide wiring in enlarged line width (step S303). The routing of ordinary signals may also be performed simultaneously. The wiring of ordinary signals, namely signals other than differential signals, is routed at an ordinary line width.

Figure 6:
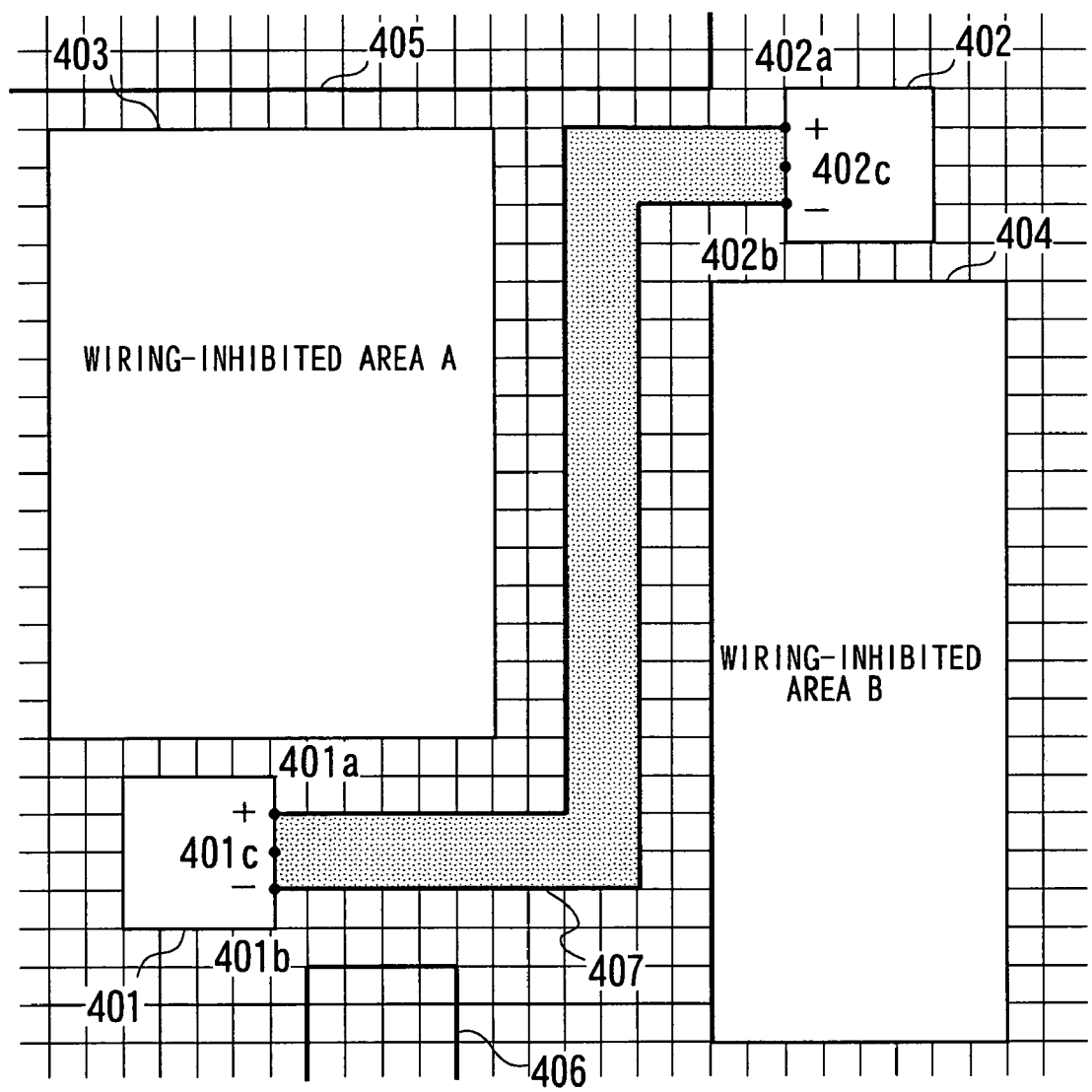

FIG. 6 illustrates one example. A guide wiring 407 of enlarged line width is passed between the dummy output terminal 401c and dummy output terminal 402c while avoiding the wiring-inhibited area (A) 403 and wiring-inhibited area (B) 404 and so as not to overlap ordinary signal wiring 405 and 406.

It is determined whether the guide wiring 407 is capable of being routed (i.e., whether a search for a path of the guide wiring succeeded or not) (step S304). If routing cannot be performed, then wiring is impossible and processing is terminated.

If it is determined at step S304 that a path could be found (i.e., that wiring is possible), then the large-to-small line width converter 124 reduces the line width of the guide wiring 407, which was routed at a large line width, in order to route the differential signals (step S305).

Figure 7:
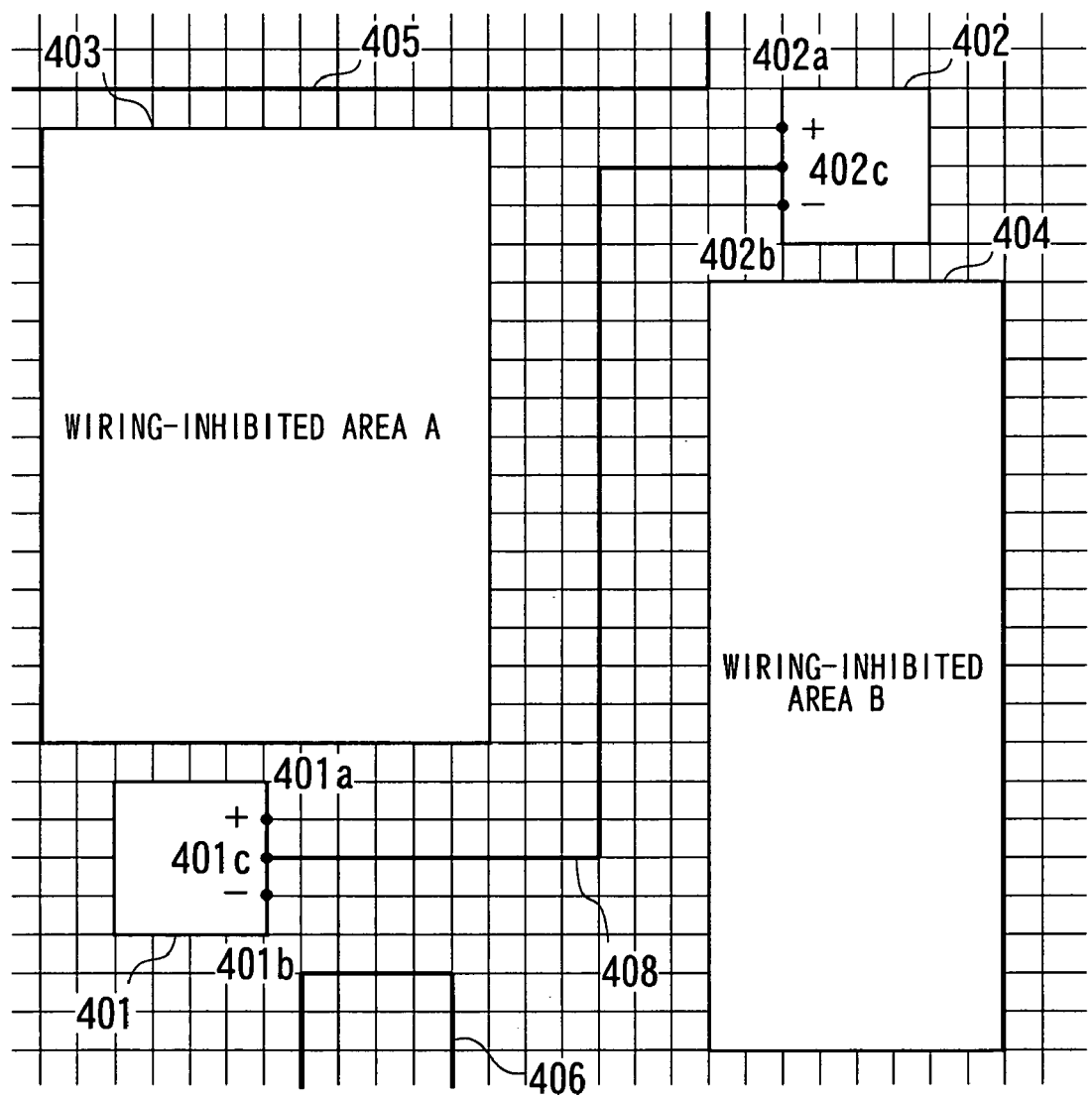

FIG. 7 illustrates the result of reducing the line width of the guide wiring 407 of FIG. 6. The dummy output terminal 401c and dummy output terminal 402c are connected by a wiring 408 of reduced line width. By narrowing the line width of the guide wiring 407 originally of enlarged line width, an area in which differential signals are laid out appears along the narrowed wiring 408. The differential-signal routing unit 125 passes a differential-signal wiring pair through the area along the narrowed wiring 408 (step S306).

Figure 8:
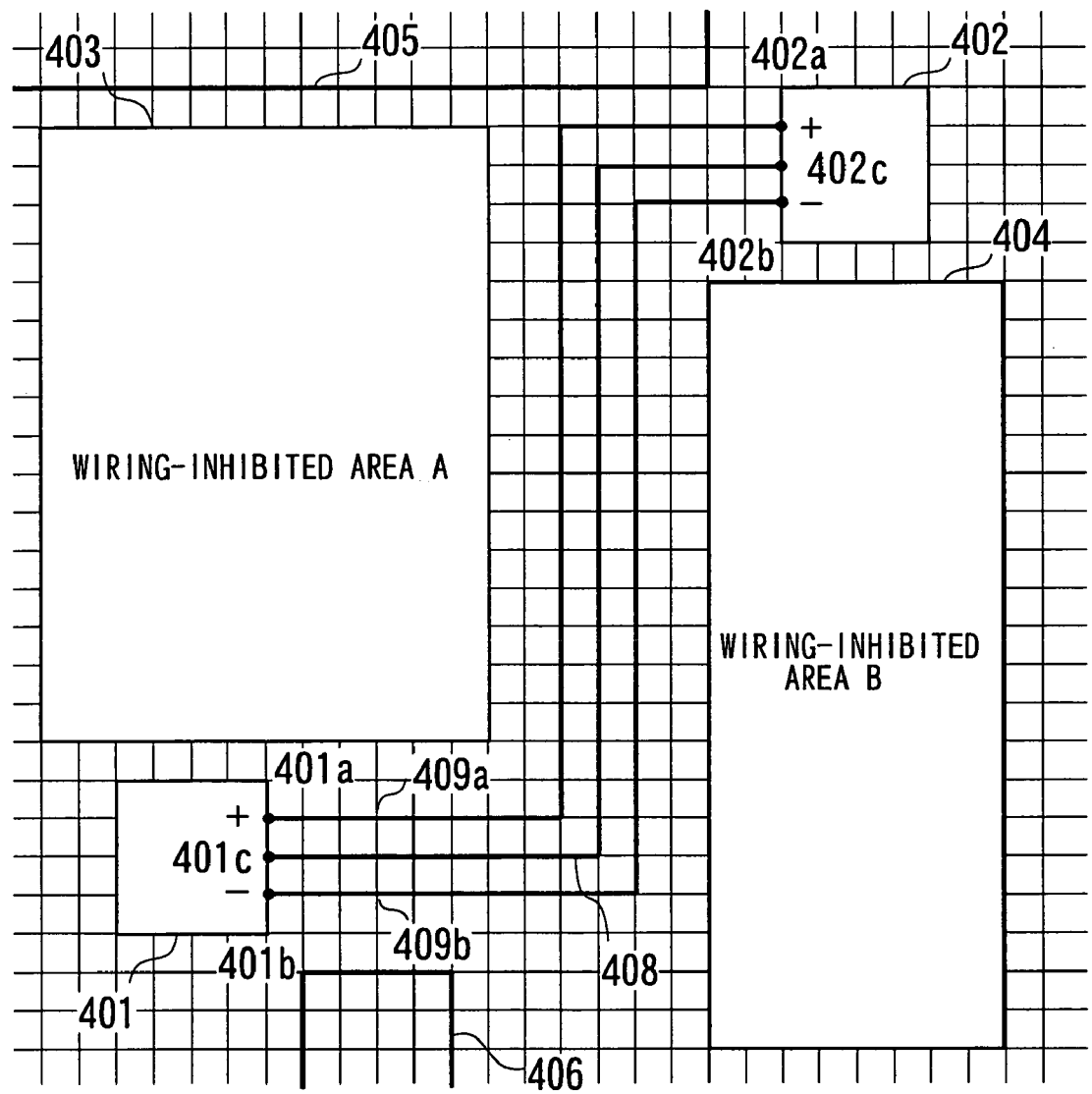

FIG. 8 illustrates the result of routing a differential-signal wiring pair 409a and 409b. The wiring 409a and the wiring 409b are passed between the positive-phase outputs 401a and 402a and between the negative-phase outputs 401b and 402b, respectively, along respective ones of both sides of the narrowed wiring 408. It is preferred that the differential-signal wiring pair 409a and 409b be routed in parallel with each other and that they be of equal length.

The present embodiment is such that in searching for a path, an area once reserved by the guide wiring of enlarged line width 407 is adopted as a route for a differential-signal wiring pair. As a result, the routing of the differential-signal wiring pair 409a and 409b can be achieved without fail. That is, in accordance with the present embodiment, there is never any re-routing of a differential-signal wiring pair. In other words, the problem of the prior art is solved, namely the problem in which when the routing of one wiring of a differential-signal wiring pair fails after the other wiring of the differential-signal wiring pair is routed, the other wiring of the differential-signal wiring pair must be re-routed.

Further, as illustrated in FIG. 8, it may be so arranged that the wiring 408, which is the result of reducing the line width of the guide wiring drawn in large line width, is deleted and made wiring-inhibited areas 410 to thereby reserve an area for the differential-signal wiring pair 409a and 409b.

Figure 12:
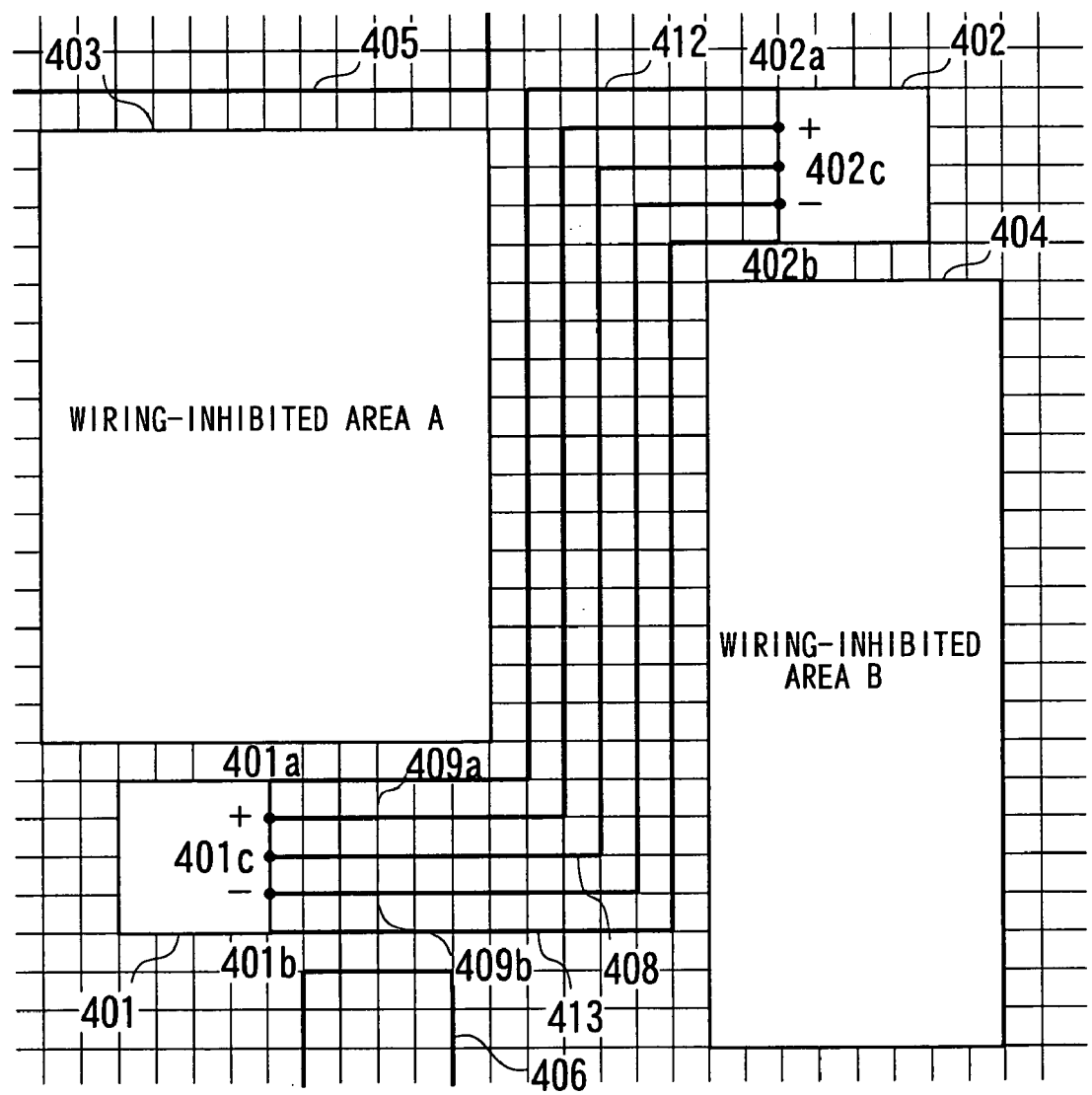

Signal-to-signal shielding is performed by the shield wiring routing unit 126 (shielding wirings are indicated at 412 and 413 in FIG. 12, by way of example). At this time it is possible to supply the wiring 408 of reduced line width with a prescribed potential from the wiring layer by providing a through-hole. The wiring 408 of reduced line width may be used as a wiring for shielding.

The post-routing layout data 110 is output to the output unit (step S307 of FIG. 3) to complete the operation for automatic routing of the differential signals. It goes without saying that examples of the output unit are a file device (storage device), a storage unit such as tape, a display unit and a printer.

Although the wiring layer is described as being only a single layer in the present embodiment, operation is similar also in the case of multiple layers.

In accordance with the present embodiment, a route search is conducted for a wiring of a line width large enough to encompass an area for routing differential signals. By using a guide wiring, the signal routing search can be conducted only a single time.

Further, in accordance with the present embodiment, if the guide wiring of reduced line width is left as a shield wiring midway between the pair of differential-signal wirings, the capacitance between the differential-signal wirings can be reduced in comparison with an arrangement in which there is no shielding and the distance between the differential-signal wirings is very small.

Figure 9:
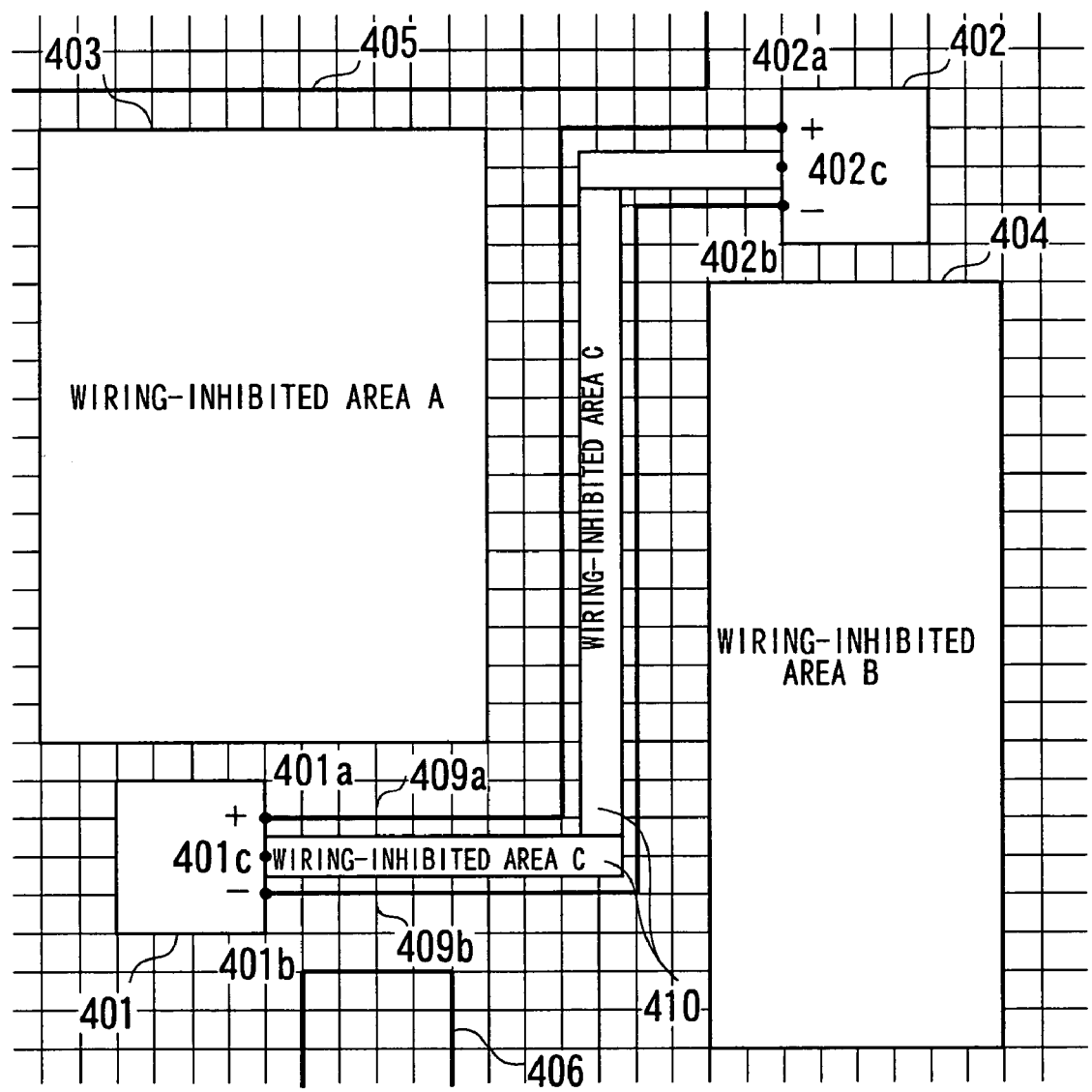

Further, in accordance with the present embodiment, even if the guide wiring is eliminated and a wiring-inhibited area is adopted instead, as illustrated in FIG. 9, a spacing equivalent to this zone is obtained between the wirings and the capacitance between the wirings can be reduced as a result.

A second embodiment of the present invention will now be described. Here routing of a wiring of even greater width is performed in order to lay shielding on the outer sides of the differential-signal wirings.

Figure 10:
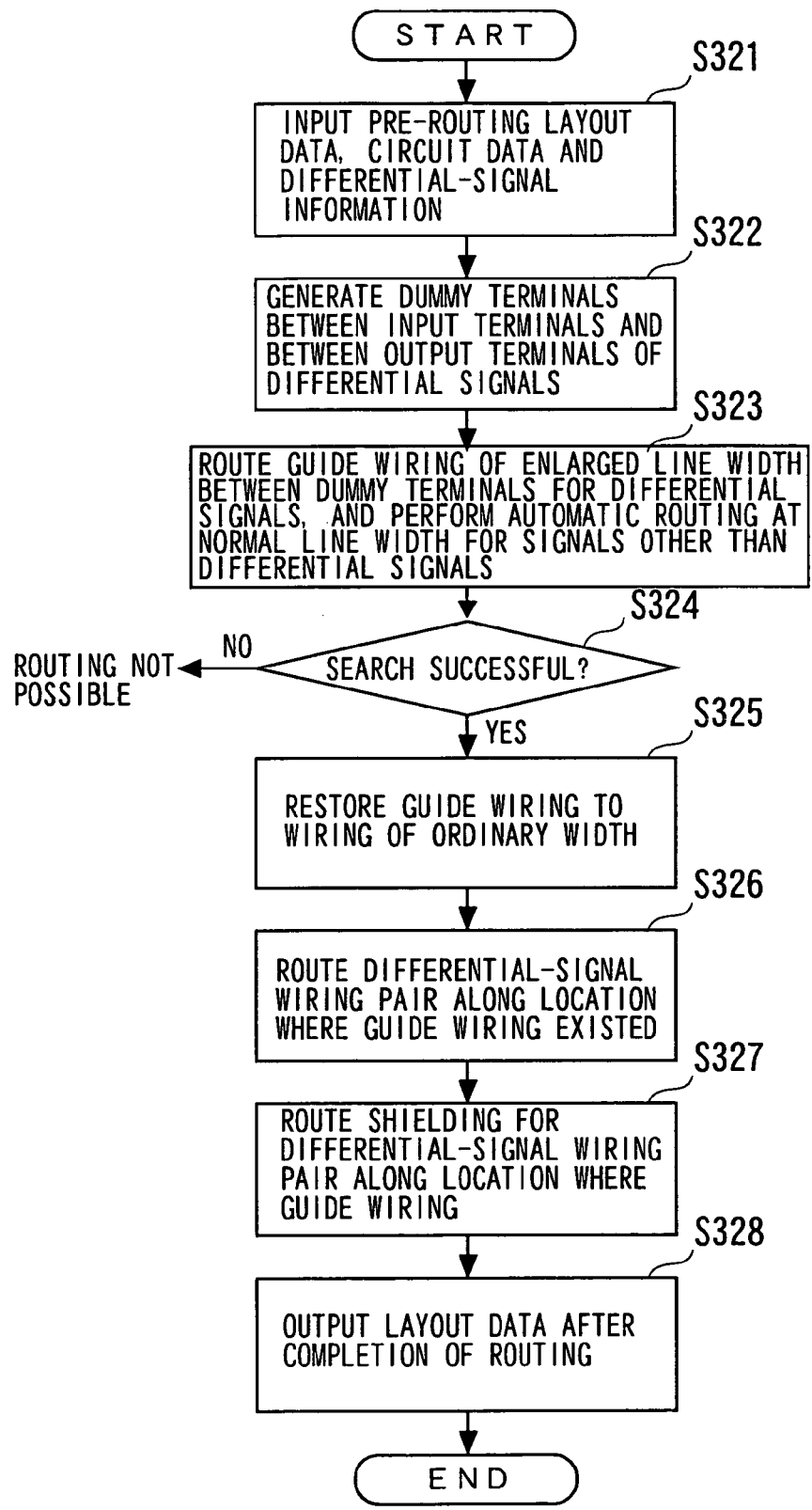
FIG. 10 is a flowchart illustrating processing according to another embodiment of the present invention.

FIG. 10 is a flowchart illustrating the flow of processing according to the second embodiment of the present invention. This flowchart differs from that of FIG. 3 in that shield routing processing (step S327) is inserted between routing processing (step S326) for the differential-signal wiring along the circuit of the guide wiring and processing (step S328) for outputting the post-routing layout data. The present embodiment differs from the first embodiment in the trace with of the guide wiring; processing other than that for shield routing is basically the same as that of the first embodiment. Accordingly, the second embodiment will be described only in terms of its difference and a description of those portions identical with the first embodiment will be omitted where appropriate.

Further, the differential-signal routing setting unit 122 changes the line width of the wiring connecting the dummy output terminal 401c and the dummy output terminal 402c so that it will be the sum of line widths of two signal wiring, a wiring space reserved between these wirings and spaces reserved externally of the differential-wirings up to respective ones of the shield wirings. The width thus obtained is required to be at least five times the minimum wiring grid. In the present embodiment, the guide wiring has a line width that is five times the minimum wiring grid.

Figure 11:
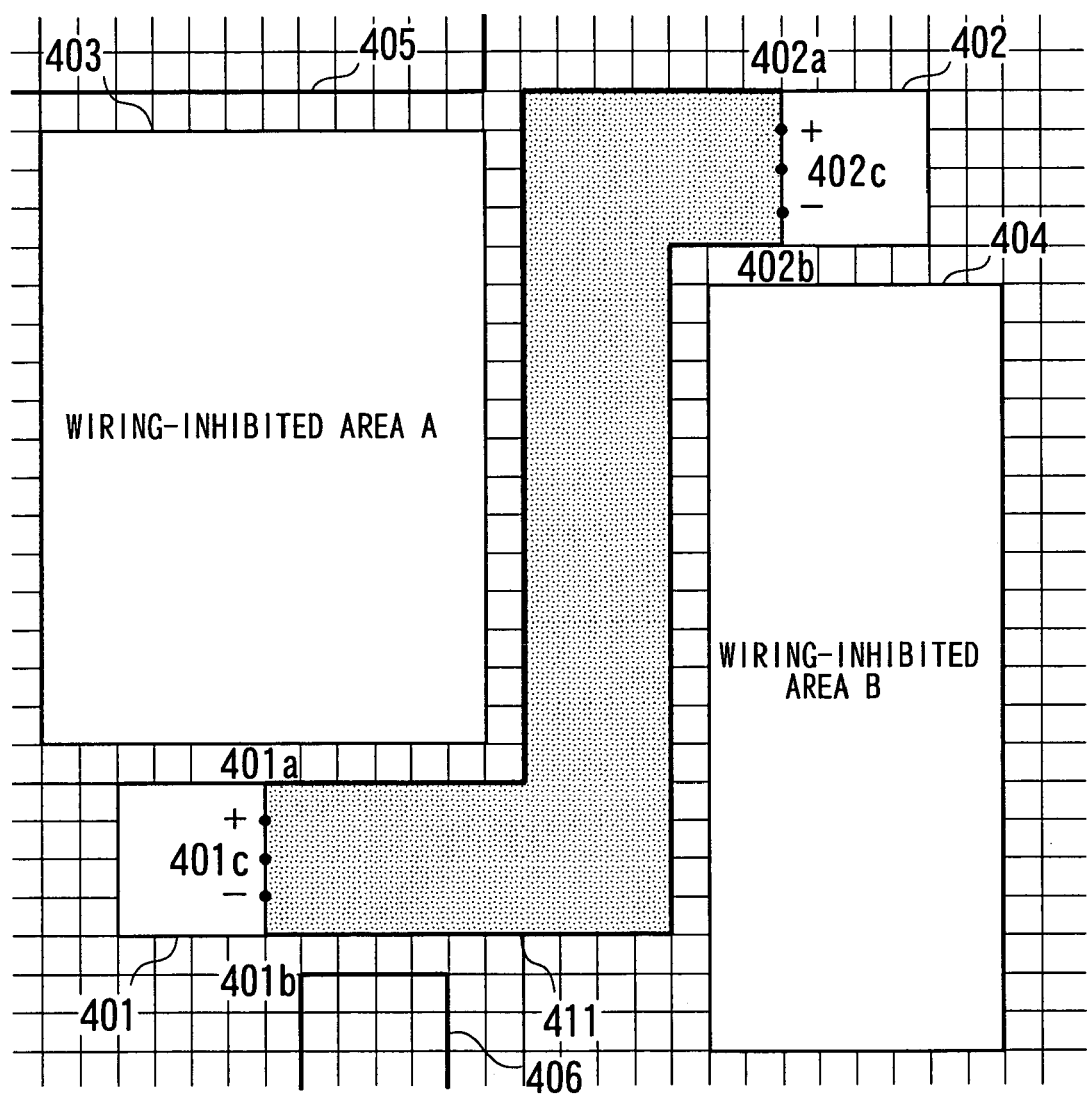
FIGS. 11 to 13 are diagrams useful in describing a routing process according to another embodiment of the present invention.
Figure 13:
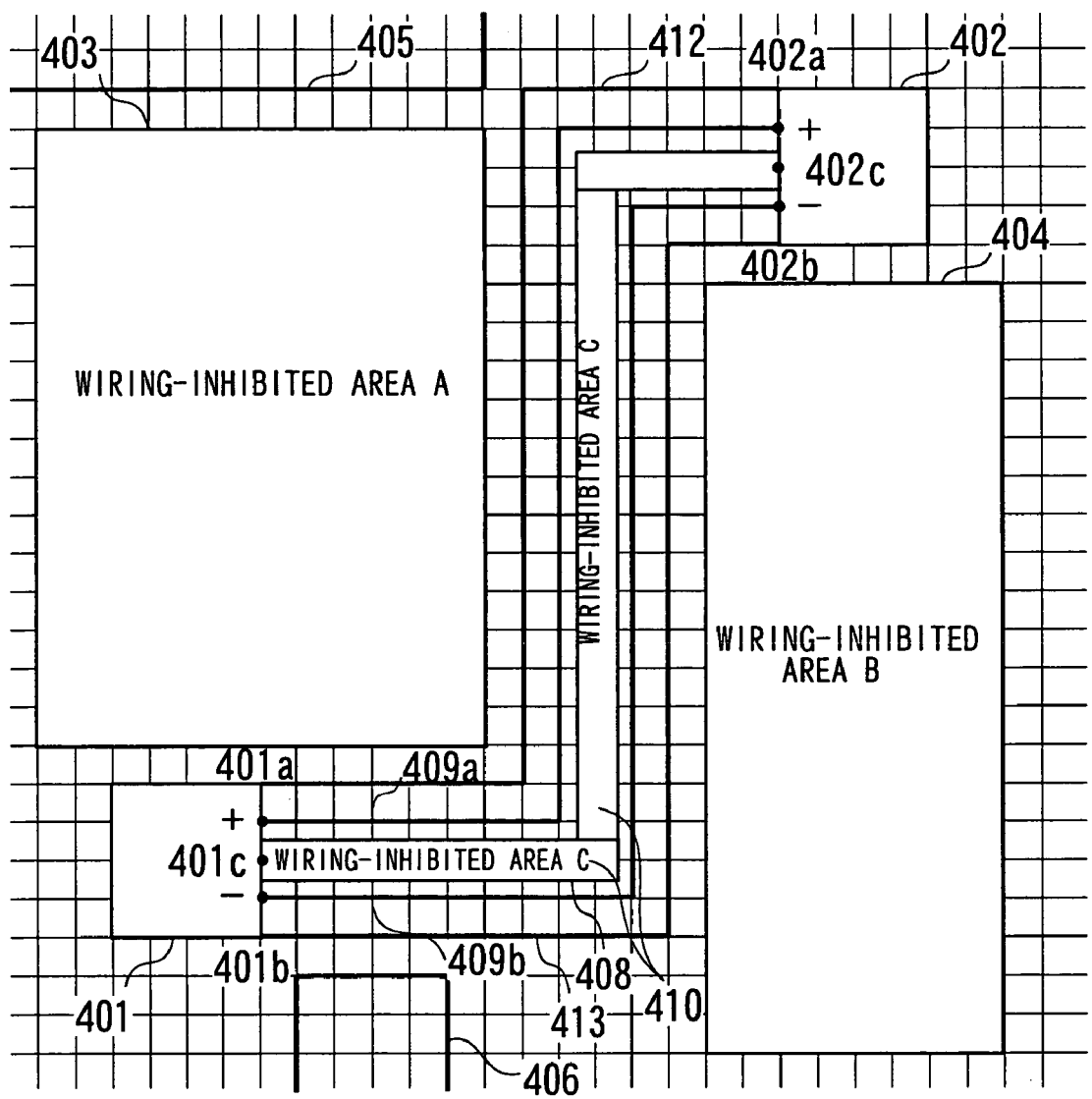
Figure 14:
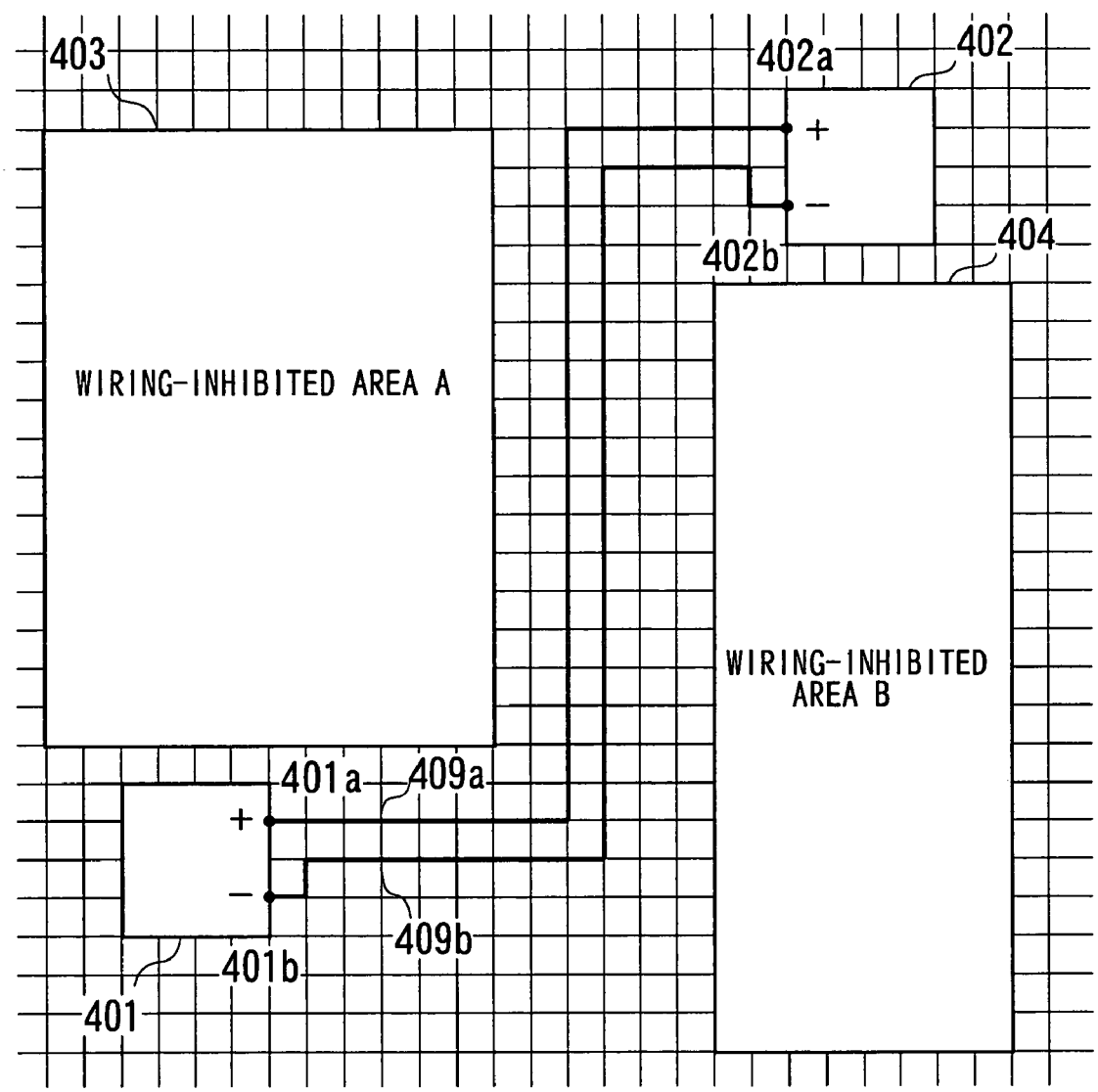
FIGS. 14 and 15 are diagrams useful in describing a conventional routing method.
Figure 15:
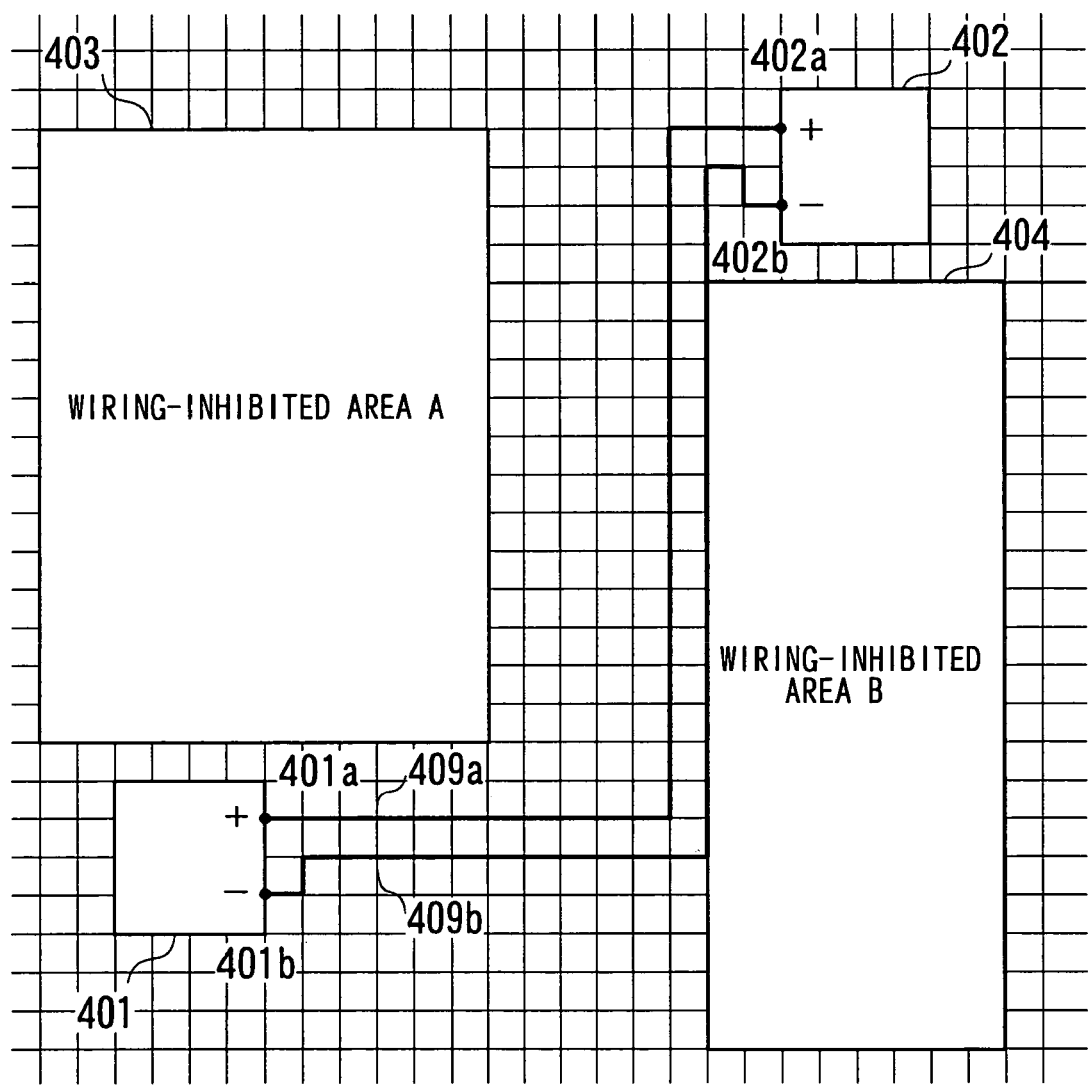

An actual example of the layout is as shown in FIG. 11 rather than FIG. 6. Specifically, a guide wiring 411 having a line width large enough to encompass the shield wirings is routed. Then, as in the first embodiment, the differential-signal wiring pair 409a and 409b are routed as illustrated in FIG. 8 (in which the wiring 408 of reduced line width is provided) or FIG. 9 (in which the wiring 408 of reduced line width is eliminated and replaced by the wiring-prohibit zones 410). The shield wirings 412 and 413 are subsequently placed outside the differential-signal wiring pair 409a and 409b, as illustrated in FIG. 12 or 13, at step S327 in FIG. 10. In the example shown in FIG. 12, the differential-signal wiring pair 409a and 409b are routed in parallel along respective ones of both sides of the reduced line width wiring 408 (that connects the dummy output terminal 401c and the dummy output terminal 402c), and the shield wirings 412 and 413 are placed externally of the differential-signal wiring pair 409a and 409b. In the example shown in FIG. 13, the differential-signal wiring pair 409a and 409b is routed in parallel along respective ones of both sides of the wiring-inhibited area 410 and the shield wirings 412 and 413 are placed externally of the differential-signal wiring pair 409a and 409b. Processing from this point onward is similar to that of the first embodiment and need not be described again.

In accordance with the present embodiment, shielding is laid on the outer side of the differential-signal wirings. In comparison with the first embodiment, a signal-degradation preventing effect is obtained and the influence of noise and crosstalk is reduced.

The present invention covers a semiconductor integrated circuit device having a layout of the kind shown in FIGS. 8, 9, 12 and 13. The semiconductor integrated circuit device of the present invention is such that a path for a guide wiring of prescribed line width is searched for in an area between first and second differential terminals, the line width of the guide wiring is narrowed or the guide wiring is eliminated to make a wiring-inhibited area, and differential-signal wirings connecting the first and second differential terminals are routed along respective ones of both sides of the wiring-inhibited area. Alternatively, shield wirings are laid with the first and second differential terminals interposed between them.

In accordance with each of the foregoing embodiments, as described above, differential-wirings of equal lengths can be found in a single attempt, path search time can be shortened and processing made more efficient.

Further, in accordance with the embodiments, a guide wiring used when routing differential signals can be left behind and used as shielding, thereby making it possible to avoid degradation of differential-signal wiring.

Further, in accordance with the embodiments, the distance between differential wirings is increased even if the guide wiring is eliminated. This makes it possible to avoid degradation of differential-signal wiring.

As many apparently widely different embodiments of the present invention can be made without departing from the spirit and scope thereof, it is to be understood that the invention is not limited to the specific embodiments thereof except as defined in the appended claims.

It should be noted that other objects, features and aspects of the present invention will become apparent in the entire disclosure and that modifications may be done without departing the gist and scope of the present invention as disclosed herein and claimed as appended herewith.

Also it should be noted that any combination of the disclosed and/or claimed elements, matters and/or items may fall under the modifications aforementioned.

What is claimed is:

1. A method of performing automatic routing of a semiconductor integrated circuit by a computer, said method comprising:
   generating a dummy output terminal between a first output terminal of a first circuit and a second output terminal of the first circuit;
   generating a dummy input terminal between a first input terminal of a second circuit and a second input terminal of the second circuit;
   searching for a path of a first guide wiring, having a line width wider than a regular line width, connecting the dummy output terminal and the dummy input terminal, and performing routing of the first guide wiring along the path; and
   passing a second guide wiring, connecting the dummy output terminal and the dummy input signal, by reducing the line width of the first guide wiring to the regular line width; and
   passing a first wiring connecting the first output terminal and the first input terminal, and a second wiring connecting the second output terminal and the second input terminal;
   wherein:
   the second guide wiring, the first wiring, and the second wiring are all located in the area that was occupied by the first guide wiring; and
   the second guide wiring is located between the first wiring and the second wiring.

2. The method according to claim 1, further comprising deleting the second guide wiring;
   adopting the area that was occupied by the second guide wiring as a wiring-inhibited area.

3. The method according to claim 1, wherein the second guide wiring is used as a shielding wiring.

4. The method according to claim 1, wherein the first and second output terminals constitute a pair of differential output terminals and the first and second input terminals constitute a pair of differential input terminals.

5. The method according to claim 1, wherein the sum of a wiring space between the first and second wirings and line widths of the first and second wirings corresponds to the line width of the first guide wiring.

6. The method according to claim 1, further comprising routing a first shielding wiring, and a second shielding wiring in such a manner that the first and second wirings are located between the first shielding wiring and the second shielding wiring.

7. The method according to claim 6, wherein the sum of a wiring space between the first and second shielding wirings and line widths of the first and second shielding wirings corresponds to the line width of the first guide wiring.

8. An apparatus for performing automatic routing of a semiconductor integrated circuit, based upon layout information and circuit information read out of a storage unit, said apparatus comprising:
   a routing setting unit for generating a dummy output terminal between a first output terminal of a first circuit and a second output terminal of the first circuit, and a dummy input terminal between a first input terminal of a second circuit and a second input terminal of the second circuit;
   a wiring path search unit for searching for a path of a first guide wiring, having a line width wider than a regular line width, connecting the dummy output terminal and the dummy input terminal, and performing routing of the first guide wiring along the path;
   a line width converter for passing a second guide wiring, connecting the dummy output terminal the dummy input signal, by reducing the line width of the first guide wiring to the regular line width; and
   a routing unit for passing a first wiring connecting the first output terminal and the first input terminal, and a second wiring connecting the second output terminal and the second input terminal;
   wherein:
   the second guide wiring, the first wiring, and the second wiring are all located in the area that was occupied by the first guide wiring; and
   the second guide wiring is located between the first wiring and the second wiring.

9. The apparatus according to claim 8, wherein:
   said line width converter deletes the second guide wiring, and adopting the area that was occupied by the second guide wiring as a wiring-inhibited area.

10. The apparatus according to claim 8, wherein the second guide wiring is adopted as a shielding wiring.

11. The apparatus according to claim 8, wherein the first and second output terminals constitute a differential output terminal pair and the first and second input terminals constitute a differential input terminal pair.

12. The apparatus according to claim 8, wherein the sum of a wiring space between the first and second wirings and line widths of the first and second wirings corresponds to the line width of the first guide wiring.

13. The apparatus according to claim 8, further comprising a unit for routing a first shielding wiring, and a second shielding wiring in such a manner that the first and second wirings are located between the first shielding wiring and the second shielding wiring.

14. The apparatus according to claim 13, wherein the sum of a wiring space between the first and second shielding wirings and line widths of the first and second shielding wirings corresponds to the line width of the first guide wiring.

15. A computer readable medium storing a computer program, the computer program, when executed by a computer, implements an apparatus for performing a method for automatic routing of a semiconductor integrated circuit, based upon layout information and circuit information read out of a storage unit, said method comprising:
   generating a dummy output terminal between a first output terminal of a first circuit and a second output terminal of the first circuit;
   generating a dummy input terminal between a first input terminal of a second circuit and a second input terminal of the second circuit;
   searching for a path of a first guide wiring, having a line width wider than a regular line width, connecting the dummy output terminal and the dummy input terminal, and performing routing of the first guide wiring along the path; and passing a second guide wiring, connecting the dummy output terminal and the dummy input signal, by reducing the line width of the first guide wiring to the regular line width; and passing a first wiring connecting the first output terminal and the first input terminal, and a second wiring connecting the second output terminal and the second input terminal;

wherein:

the second guide wiring, the first wiring, and the second wiring are all located in the area that was occupied by the first guide wiring; and the second guide wiring is located between the first wiring and the second wiring.

16. The computer readable medium according to claim 15, wherein the method further comprises:

deleting the second guide wiring;

adopting the area that was occupied by the second guide wiring as a wiring-inhibited area.

17. The computer readable medium according to claim 15, wherein the first and second output terminals constitute a differential output terminal pair and the first and second input terminals constitute a differential input terminal pair.

18. The computer readable medium according to claim 15, wherein the sum of a wiring space between the first and second wirings and line widths of the first and second wirings corresponds to the line width of the first guide wiring.

19. The computer readable medium according to claim 15, wherein the method further comprises routing a first shielding wiring, and a second shielding wiring in such a manner that the first and second wirings are located between the first shielding wiring and the second shielding wiring.

20. The computer readable medium according to claim 19, wherein the sum of a wiring space between the first and second shielding wirings and line widths of the first and second shielding wirings corresponds to the line width of the first guide wiring.

* * * * *